US 6,597,262 B2

(12) United States Patent
Takamine

(10) Patent No.: US 6,597,262 B2
(45) Date of Patent: Jul. 22, 2003

(54) SURFACE ACOUSTIC WAVE FILTER AND COMMUNICATION APPARATUS INCORPORATING THE SAME

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/971,033

(22) Filed: Oct. 5, 2001

(65) Prior Publication Data
US 2002/0075101 A1 Jun. 20, 2002

(30) Foreign Application Priority Data
Oct. 27, 2000 (JP) ........................................ 2000-328992

(51) Int. Cl.⁷ ................................................. H03H 9/64
(52) U.S. Cl. ........................ 333/193; 333/195; 333/133; 310/313 B
(58) Field of Search ................................. 333/193–196, 333/133; 310/313 R, 313 B, 313 C, 313 D

(56) References Cited

U.S. PATENT DOCUMENTS

| 5,790,000 | A | * | 8/1998 | Dai et al. ..................... 333/193 |
| 5,874,869 | A | * | 2/1999 | Ueda et al. ................... 333/193 |
| 5,994,980 | A | | 11/1999 | Tada ............................ 333/193 |
| 6,160,339 | A | * | 12/2000 | Takagi et al. ............ 310/313 D |
| 6,255,915 | B1 | * | 7/2001 | Edmonson ................... 333/193 |

FOREIGN PATENT DOCUMENTS

| EP | 0 884843 A2 | * | 12/1998 |
| JP | 4-113712 | * | 4/1992 |
| JP | 05-335881 | | 12/1993 |
| JP | 07-283689 | | 10/1995 |
| JP | 9-130203 | * | 5/1997 |
| JP | 2000-091883 A | | 3/2000 |
| JP | 2001-144574 | * | 5/2001 |
| JP | 2001-217680 | * | 8/2001 |
| JP | 2001-345666 A | | 12/2001 |

* cited by examiner

Primary Examiner—Barbara Summons
(74) Attorney, Agent, or Firm—Keating & Bennett, LLP

(57) ABSTRACT

A surface acoustic wave filter that minimizes parallel capacitances generated at the interstage junction of longitudinally connected surface acoustic wave elements so that the impedance of each element is hardly capacitive, includes a piezoelectric substrate, two longitudinally-coupled resonator-type surface acoustic wave elements having a plurality of interdigital transducers disposed on the piezoelectric substrate in a direction in which a surface acoustic wave propagates, electrode pads defining input/output terminals of the longitudinally-coupled resonator-type surface acoustic wave elements, and wiring patterns for electrically connecting the longitudinally-coupled resonator-type surface acoustic wave elements. The two longitudinally-coupled resonator-type surface acoustic wave elements are longitudinally connected to each other via the wiring patterns. At least one of the electrode pads is arranged between the two longitudinally connected surface acoustic wave elements.

20 Claims, 4 Drawing Sheets

SURFACE ACOUSTIC WAVE FILTER AND COMMUNICATION APPARATUS INCORPORATING THE SAME

BACKGROUND OF THE INVENTION

1. Field of the Invention

The present invention relates to surface acoustic wave filters suitable for use in mobile communication apparatuses such as mobile phones. More particularly, the present invention relates to wiring structures of longitudinally-coupled resonator-type surface acoustic wave filters.

2. Description of the Related Art

As a conventional band pass filter used in the RF stage of a mobile communication apparatus such as a mobile phone, a surface acoustic wave filter is well known. In general, capabilities required in such a band pass filter include characteristics of low loss, high attenuation, a broad band, and other known characteristics. Thus, in order to improve these characteristics of the surface acoustic wave filter, there have been many inventions developed in the past.

For example, in order to obtain high attenuation in a longitudinally-coupled resonator-type surface acoustic wave filter, a method is known in which a surface acoustic wave filter is constituted by longitudinally connecting a plurality of longitudinally-coupled resonator-type surface acoustic wave elements, as described in Japanese Unexamined Patent Application Publication No. 5-335881. In this method, since the plurality of surface acoustic wave elements are longitudinally connected to each other, there is a disadvantage that insertion loss within the pass band increases. On the other hand, high attenuation outside the pass band can be obtained.

However, when constituting a filter having a broad pass bandwidth by longitudinally connecting the longitudinally-coupled resonator-type surface acoustic wave elements as mentioned above, waves within the pass band and the voltage standing wave ratio (VSWR) both become large. Next, the cause of the problem will be explained with reference to FIG. 6.

FIG. 6 is a plan view of a conventional surface acoustic wave filter 100 constructed by longitudinally connecting two longitudinally-coupled resonator-type surface acoustic wave elements. In this figure, the reference numeral 138 denotes a piezoelectric substrate made of LiTaO₃. The reference numerals 101 and 102 denote longitudinally-coupled resonator-type surface acoustic wave elements arranged on the piezoelectric substrate 138. The surface acoustic wave element 101 is composed of an IDT (interdigital transducer) 103, two IDTs 104 and 105 located on each side of the IDT 103, and two reflectors 106 and 107 disposed on each side of the arrangement of the IDTs 104, 103, and 105. In the same manner, the surface acoustic wave element 102 is composed of IDTs 108, 109, and 110, with reflectors 111 and 112. The two surface acoustic wave elements 101 and 102 are longitudinally connected to each other to constitute the surface acoustic wave filter 100. The filter 100 is electrically connected to bonding pads 123 to 128 on a package 137 via bonding wires 129 to 136. The bonding pad 124 is used as an input terminal, the bonding pad 127 is used as an output terminal, and the bonding pads 123, 125, 126, and 128 are used as ground terminals. In addition, electrode pads 113 to 120 are provided on the piezoelectric substrate 138 so as to correspond to the bonding pads 123 to 128 disposed on the package 137. The electrode pad 114 is used as an input terminal, the electrode pad 119 is used as an output terminal, and the electrode pads 113, 115, 116, 117, 118, and 120 are used as ground terminals. Furthermore, in order to longitudinally connect the surface acoustic wave elements 101 and 102, an electrode pattern 121 for connecting the IDTs 104 and 109 and an electrode pattern 122 for connecting the IDTs 105 and 110 are disposed on the piezoelectric substrate 138.

In the surface acoustic wave filter 100 having the above-described arrangement, parallel capacitances are generated between the electrode pad 116 as a ground terminal and the electrode patterns 121 and 122 and between the electrode pad 117 as a ground terminal and the electrode patterns 121 and 122, respectively. When the parallel capacitances are generated between the ground-terminal pads and the electrode patterns through which a passing signal is transmitted, the impedance of each element viewed from the interstage junction tends to be capacitive.

Primarily, in a surface acoustic wave filter having a broad pass bandwidth, the impedance tends to be capacitive. As shown in the conventional filter in FIG. 6, in the structure in which the parallel capacitances are generated at the interstage junction of the longitudinally connected surface acoustic wave elements, the impedance tends to be more capacitive. As a result, waves within the pass band and the VSWR both become larger, resulting in the filter characteristics being significantly deteriorated.

SUMMARY OF THE INVENTION

In order to solve the problems described above, preferred embodiments of the present invention provide a surface acoustic wave filter having a broad pass bandwidth that minimizes generation of parallel capacitances at the interstage junctions of longitudinally connected surface acoustic wave elements so that the impedance of each element is hardly capacitive.

According to a preferred embodiment of the present invention, a surface acoustic wave filter includes a piezoelectric substrate, a plurality of longitudinally-coupled resonator-type surface acoustic wave elements having a plurality of interdigital transducers (IDTs) disposed on the piezoelectric substrate in a direction in which a surface acoustic wave propagates, electrode pads defining input/output terminals of the longitudinally-coupled resonator-type surface acoustic wave elements, and wiring patterns for electrically connecting the plurality of longitudinally-coupled resonator-type surface acoustic wave elements. In this filter, at least one pair of the plurality of longitudinally-coupled resonator-type surface acoustic wave elements is longitudinally connected to each other via the wiring patterns, and at least one of the electrode pads is arranged between the longitudinally connected surface acoustic wave elements.

In this arrangement, since at least one of the electrode pads defining input/output terminals is arranged between the longitudinally connected surface acoustic wave elements, parallel capacitances generated at the interstage junction of the surface acoustic wave elements are minimized and eliminated.

In addition, according to another preferred embodiment of the present invention, a surface acoustic wave filter includes the structure of the filter according to the preferred embodiment described in the preceding paragraph. In this filter, at least one of the longitudinally-coupled resonator-type surface acoustic wave elements is one of a balanced-input type and a balanced-output type so as to achieve a balance-unbalance conversion function.

When applying the structure of the filter of the first preferred embodiment to the filter having the balance-unbalance conversion function according to the other preferred embodiment, parallel capacitances generated at the interstage junction are minimized, thereby improving balancing in the balance-unbalance conversion, which is an additional advantage that is achieved in this structure.

Furthermore, according to another preferred embodiment of the present invention, a communication apparatus includes the surface acoustic wave filter according to one of the above-described preferred embodiments.

Other features, elements, characteristics and advantages of the present invention will become more apparent from the following detailed description of preferred embodiments of the present invention.

DETAILED DESCRIPTION OF PREFERRED EMBODIMENTS

A filter according to a first preferred embodiment of the present invention, which takes a reception filter incorporated in an extended group special mobile (EGSM) communication apparatus as an example, will be described with reference to FIGS. 1 to 3.

Figure 1:
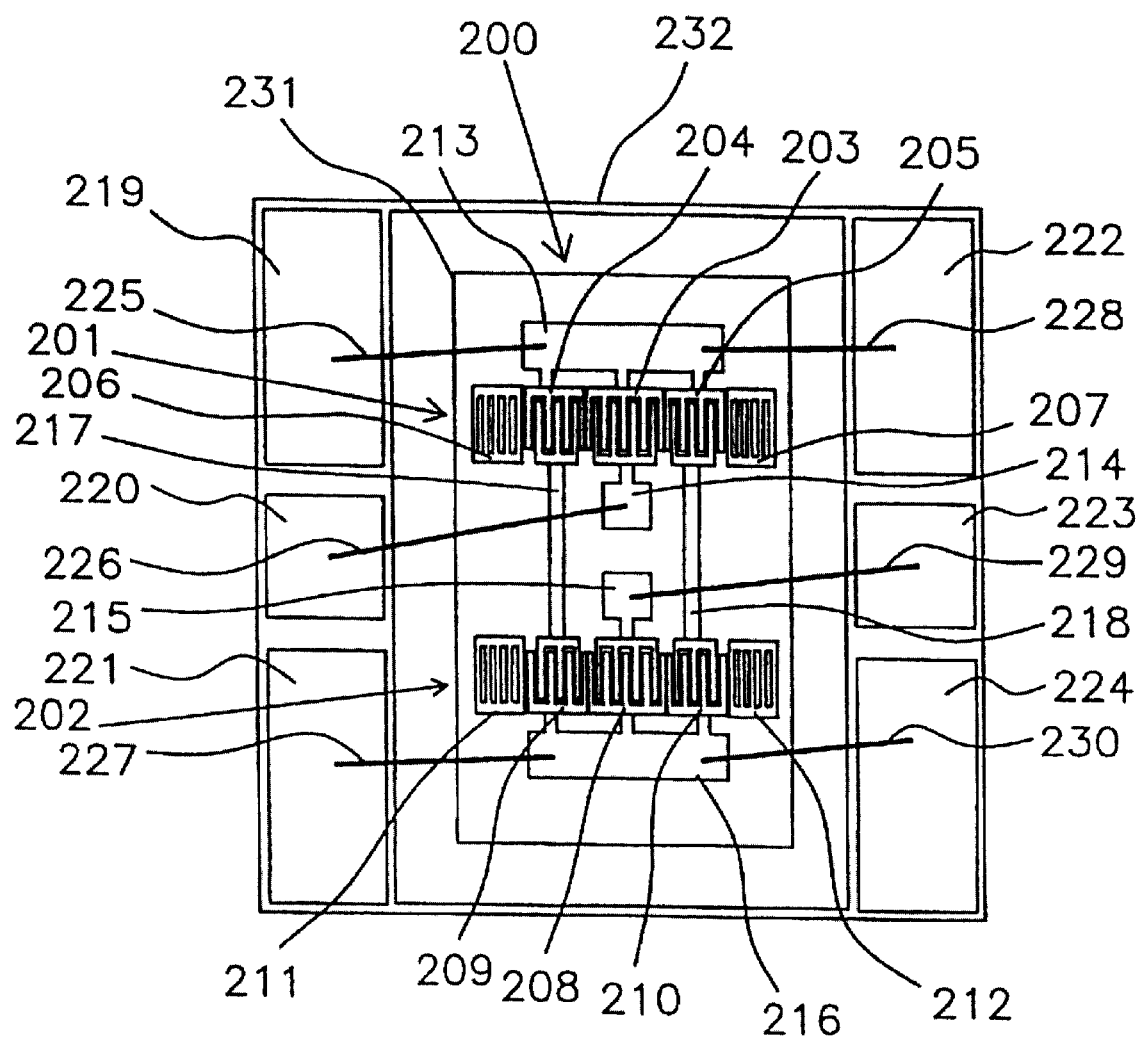
FIG. 1 is a schematic plan view of a surface acoustic wave filter according to a first preferred embodiment of the present invention.

FIG. 1 is a schematic plan view of the reception filter. In this figure, a piezoelectric substrate 231 that is preferably a 40±5° Y-cut X-propagation $LiTaO_3$ substrate has mounted thereon two longitudinally-coupled resonator-type surface acoustic wave elements 201 and 202, which are longitudinally connected to each other to constitute a surface acoustic wave filter 200.

The longitudinally-coupled resonator-type surface acoustic wave element 201 preferably includes an IDT (interdigital transducer) 203, IDTs 204 and 205 arranged on each side of the IDT 203, and reflectors 206 and 207 disposed on each side of the area occupied by the IDTs 204, 203, and 205. The pitches of a few electrode fingers positioned between the IDTs 203 and 204 and between the IDTs 203 and 205 are preferably narrower than the pitches of the remaining fingers of the IDTs. These will be referred to as narrow-pitch electrode fingers. In a manner similar to the surface acoustic wave element 101, the surface acoustic wave element 202 preferably includes an IDT 208, IDTs 209 and 210, and reflectors 211 and 212. In FIG. 1, for simple illustration, there are shown less electrode fingers, although the surface acoustic wave filter actually has many more electrode fingers.

The surface acoustic wave filter 200 disposed on the piezoelectric substrate 213 is mounted in a package 232 to be electrically connected to bonding pads 219 to 224 provided in the package 232 via bonding wires 225 to 230. The bonding pad 220 is used as an input terminal, the bonding pad 223 is used as an output terminal, and the bonding pads 219, 221, 222, and 224 are used as ground terminals. In addition, on the piezoelectric substrate 231 electrode pads 213 to 216 are arranged to correspond to the bonding pads on the package 232. The electrode pad 214 is used as an input terminal, the electrode pad 215 is used as an output terminal, and the electrode pads 213 and 216 are used as ground terminals. Furthermore, in order to longitudinally connect the surface acoustic wave elements 201 and 202, an electrode pad 217 connecting the IDTs 204 and 209 and an electrode pad 218 connecting the IDTs 205 and 210 on the piezoelectric substrate 231 are provided.

The numbers and pitches of electrode fingers of the surface acoustic wave elements 201 and 202 are arranged as follows. A wavelength determined by the pitch of narrow-pitch electrode fingers is λ2 and a wavelength determined by the pitches of other electrode fingers is λ1.

The cross-width W is preferably about 35.8 λ1. The numbers of electrode fingers of the IDTs 204, 203, and 205 are preferably 25 (4), (4) 27 (4), and (4b) 25 in the aligned sequence. The numbers given in the parentheses represent the numbers of narrow-pitch electrode fingers of the IDTs 204, 203, and 205. The IDT wavelength λ1 is preferably about 4.19 μm, the IDT wavelength λ2 is preferably about 3.89 μm, and the reflector wavelength λR is preferably about 4.29 μm. The number of reflectors is preferably 100. The distance between the centers of electrode fingers of the IDTs, that is, the gap between the electrode fingers of the wavelength λ1 and the electrode fingers of the wavelength λ2 is preferably approximately 0.25 λ1+0.25 λ2 and the gap between the electrode fingers of the wavelength λ2 is preferably approximately 0.50 λ2. The IDT-reflector gap is preferably about 0.50 λ2. The IDT duty is preferably about 0.73, and the reflector duty is preferably about 0.55. The electrode material is preferably Al, and the electrode film thickness is preferably about 0.08 λ1.

As the characteristic arrangement of this preferred embodiment, the electrode pads 214 and 215 as the input and output terminals of the surface acoustic wave filter 200 are arranged between the longitudinally connected longitudinally-coupled resonator-type surface acoustic wave elements 201 and 202. More specifically, the electrode pads 214 and 215 are arranged in a region enclosed by the mutually opposing surface acoustic wave elements 201 and 202 and the wiring patterns 217 and 218 connecting the surface acoustic wave elements 201 and 202. Furthermore, the electrode pads used as the ground terminals are arranged outside the mutually opposing surface acoustic wave elements 201 and 202.

As shown in this preferred embodiment, the electrode pads arranged between the longitudinally connected longitudinally-coupled resonator-type surface acoustic wave elements 201 and 202 are pads used as input/output terminals, instead of ground terminals as in the arrangement of the conventional art. With this arrangement, the wiring patterns and the electrode pads as ground terminals can be isolated from each other physically. As a result, the generation of a parallel capacitance at the interstage junction of the surface acoustic wave elements is effectively minimized.

Figure 2:
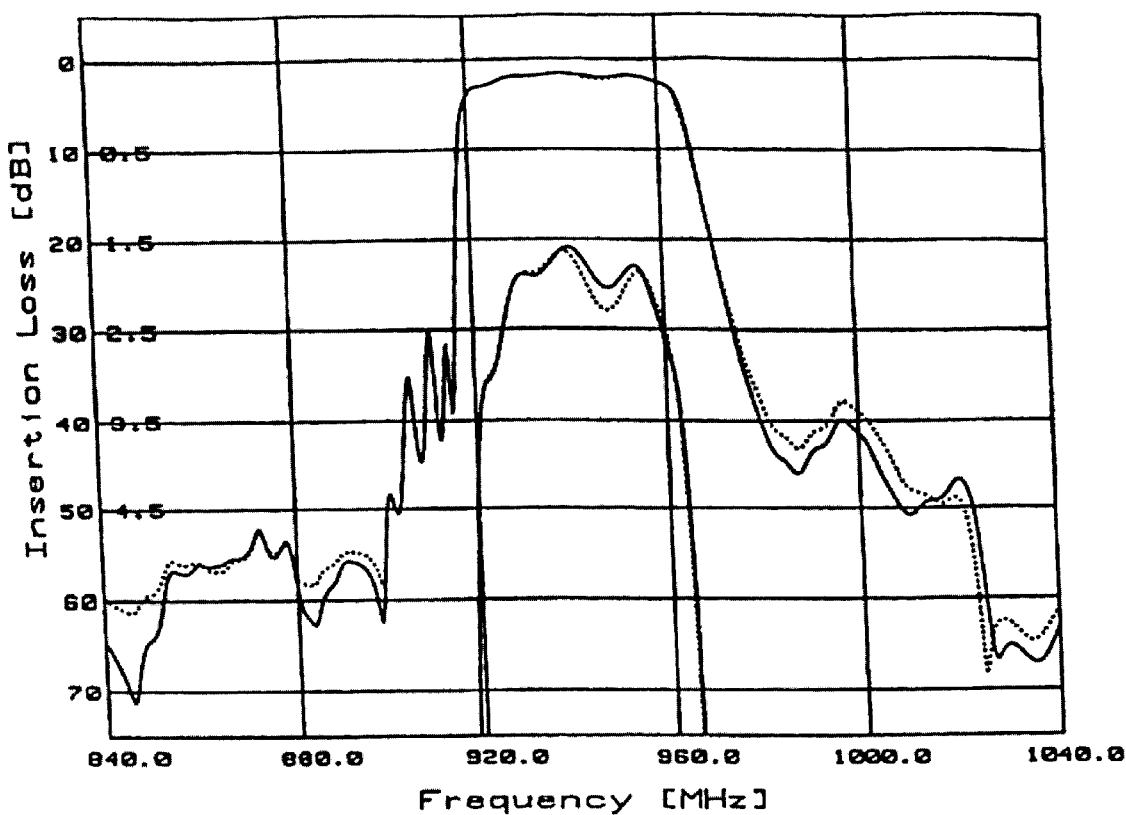
FIG. 2 is a graph showing the difference between frequency characteristics between the surface acoustic wave filter of the first preferred embodiment and a conventional surface acoustic wave filter.
Figure 3:
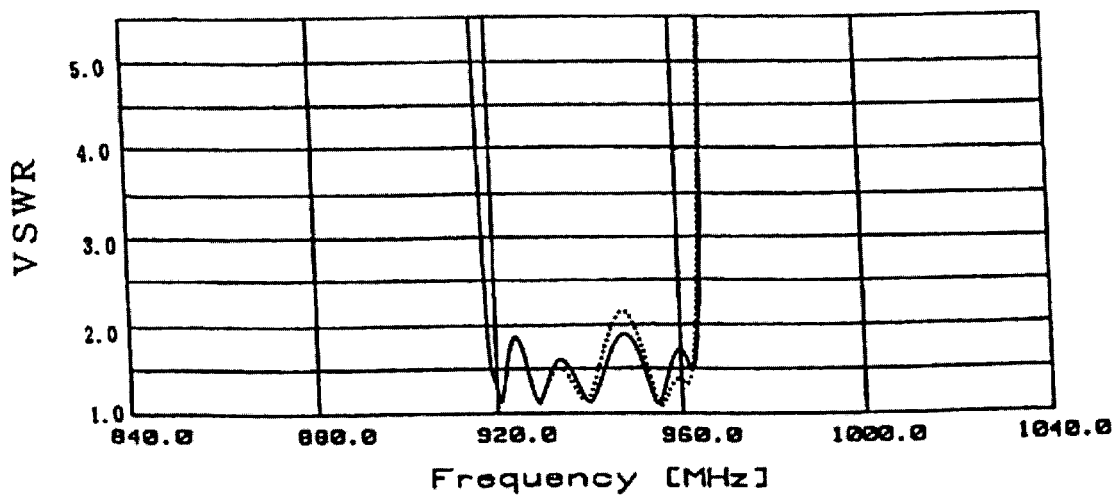
FIG. 3 is a graph showing a difference in the voltage standing wave ratios between the surface acoustic wave filter of the first preferred embodiment and the conventional surface acoustic wave filter.
Figure 6:
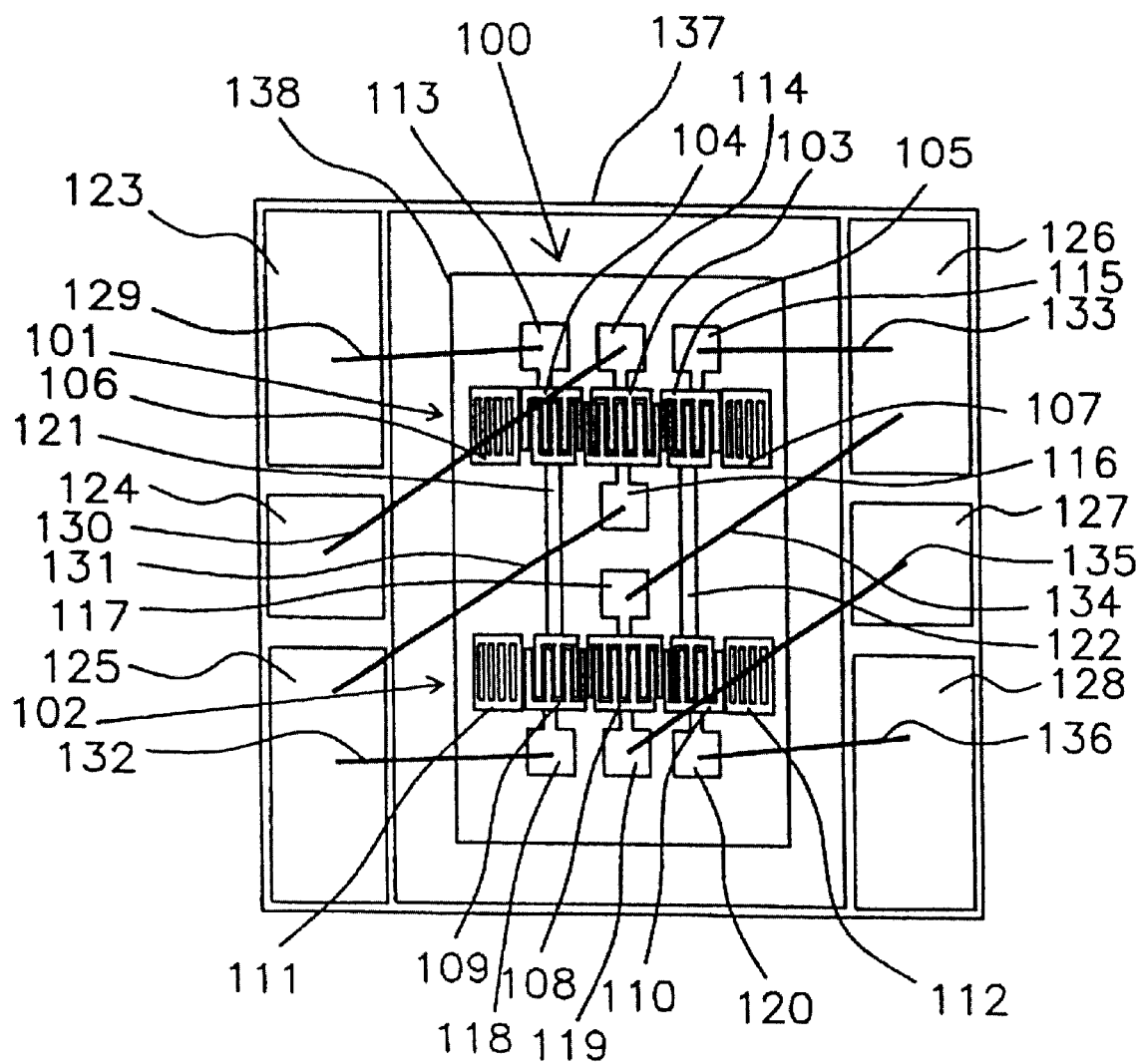
FIG. 6 is a schematic plan view of the conventional surface acoustic wave filter.

FIGS. 2 and 3 each show the difference of frequency characteristics between the surface acoustic wave filter 200 of the present preferred embodiment and the conventional surface acoustic wave filter shown in FIG. 6 and a difference in the voltage standing wave ratios (VSWR) between the filters. In both figures, the solid line represents the characteristics of the surface acoustic wave filter 200 of the present preferred embodiment and the broken line represents the characteristics of the conventional surface acoustic wave filter. In FIG. 2, it is shown that wave within the pass band in the filter of this preferred embodiment is small. In FIG. 3, obviously, the VSWR of this preferred embodiment is smaller and the pass bandwidth from a through-level to about 4 dB is approximately 0.4 MHz broader.

While the input electrode pad 214 and the output electrode pad 215 are arranged between the longitudinally connected surface acoustic wave elements 201 and 202, the electrode pads as ground terminals are arranged outside the surface acoustic wave elements. Thus, as in the arrangement of the present preferred embodiment, by connecting to a single electrode pad, the number of bonding wires can be greatly reduced, which is an additional advantage. Furthermore, as seen in FIG. 2, in the filter of this preferred embodiment, attenuation characteristics between about 980 MHz and about 1020 MHz are greatly improved. This results from stray capacitances generated between the electrode pads 214 and 215 and the wiring patterns 217 and 218 functioning as bridging capacitances. The present preferred embodiment of the present invention can also provide an additional advantage that the attenuation characteristics of the filter are greatly improved.

As described above, in the surface acoustic wave filter of the present preferred embodiment, even when it is an EGSM reception filter having a broad pass bandwidth, waves within the pass band and the VSWR are small so that the impedance of each element hardly becomes capacitive.

In this preferred embodiment, both the input electrode pad and the output electrode pad are arranged between the two surface acoustic wave elements. However, only one of them may be arranged between the elements. In addition, in this preferred embodiment, the electrode pads on the piezoelectric substrate are connected to the bonding pads on the package via the bonding wires. The same advantages can be obtained in a surface acoustic wave filter mounted by facedown bonding using bumps. Additionally, this preferred embodiment uses a piezoelectric substrate of about 40±5° Y-cut X-propagation LiTaO$_3$. However, the present invention can use other kinds of substrates such as substrates of about 64° to 72° Y-cut X-propagation LiNbO$_3$ and a substrate of about 41° Y-cut X-propagation LiNbO$_3$. Furthermore, the present invention preferably uses the surface acoustic wave filter including the 3-IDT-type surface acoustic wave element that includes three IDTs. The same advantages can be obtained even with the use of multiple-electrode-type surface acoustic wave elements including two, five, or more IDTs. In addition, even when designing parameters such as the cross widths of electrode fingers in the stages and the number of electrode fingers are changed, the same advantages can be obtained.

Figure 4:
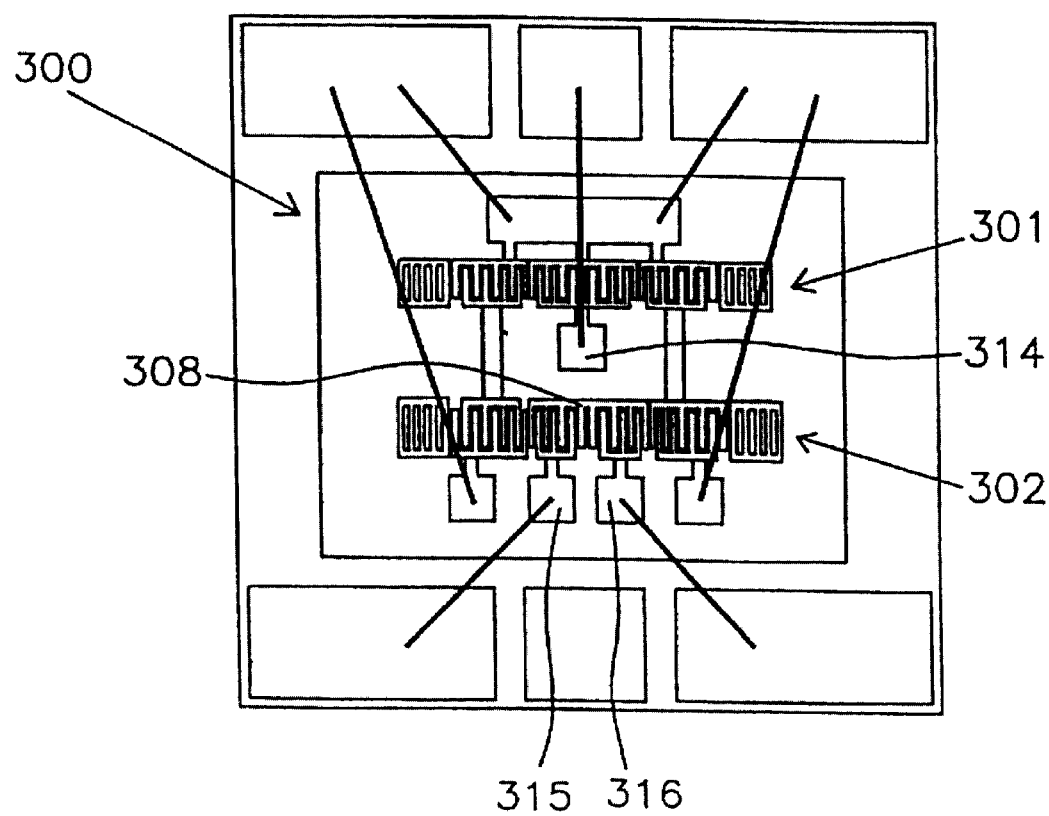
FIG. 4 is a schematic plan view of a surface acoustic wave filter according to a second preferred embodiment of the present invention.

FIG. 4 shows a schematic plan view of a surface acoustic wave filter according to a second preferred embodiment of the present invention. This filter is produced by longitudinally connecting two longitudinally-coupled resonator-type surface acoustic wave elements 301 and 302. The basic structure of the filter is preferably the same as that of the filter of the first preferred embodiment of the present invention described above. Characteristically, in the second preferred embodiment, an IDT 308 corresponding to the IDT 208 of the filter of the first preferred embodiment is split into two parts to obtain balanced outputs, which is the so-called balance-unbalance conversion function. In the surface acoustic wave filter having this structure, similarly, by arranging input/output electrode pads, that is, the input electrode pad 314 in this preferred embodiment, between the surface acoustic wave elements which are longitudinally connected, the generation of a parallel capacitance at the interstage junction of the elements is minimized. In this manner, in the surface acoustic wave filter having the balance-unbalance conversion function, when the parallel capacitance at the interstage junction is reduced, the impedance hardly becomes capacitive. In addition to this advantage, there can be another advantage that the balance of a balanced terminal is greatly improved.

In the surface acoustic wave filter 300, the electrode pads 315 and 316 led out from the rear-stage surface acoustic wave element 302 are arranged outside the surface acoustic wave element 302. However, similar to the first preferred embodiment, the pads may be arranged between the surface acoustic wave elements 301 and 302. In addition, in this preferred embodiment, only the IDT 308 of the surface acoustic wave element 302 is split to obtain the balance-unbalance conversion function. However, even in surface acoustic wave filters realizing the balance-unbalance conversion function by other arrangements, similarly, there can be obtained the advantage that the balance of a balanced terminal is greatly improved.

Figure 5:
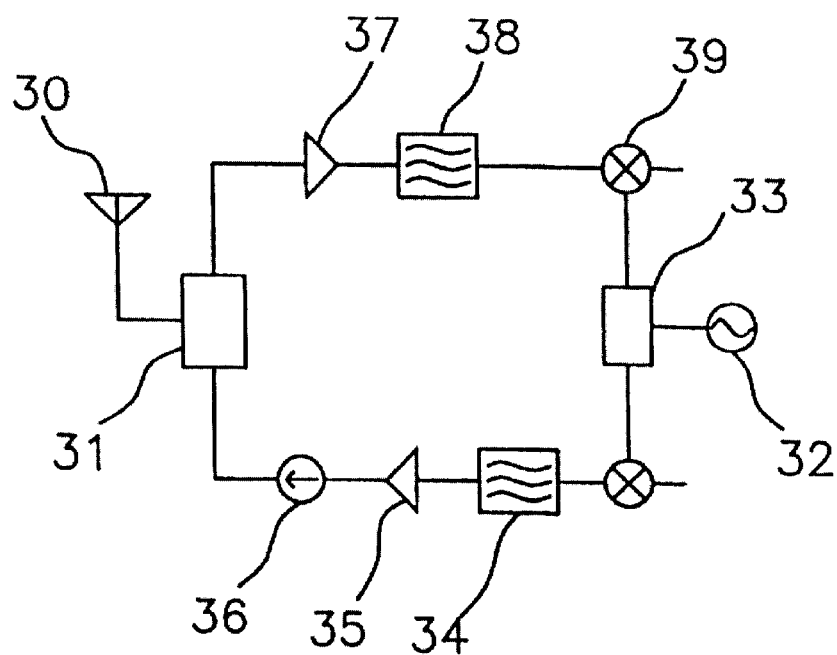
FIG. 5 is a block diagram of a communication apparatus according to a third preferred embodiment of the present invention.

Next, a description will be given of a communication apparatus according to a third preferred embodiment of the present invention with reference to FIG. 5. FIG. 5 is a block diagram of the communication apparatus.

As shown in the figure, the communication apparatus of the third preferred embodiment includes an antenna 30, a duplexer 31 connected to the antenna 30, a transmission circuit and a reception circuit connected to the duplexer 31. The transmission circuit includes an interstage filter 34 filtering a transmission signal oscillated from an oscillator 32 and divided by a divider 33, a power amplifier 35 amplifying the transmission signal, an isolator 36 preventing a reception signal from being sent to the transmission side. The reception circuit preferably includes a low noise amplifier 37 amplifying a reception signal from the antenna 30, an interstage filter 38 filtering the reception signal. Then, after mixing the reception signal and a local signal, a mixer 39 outputs an IF signal.

In the communication apparatus having such an arrangement, for example, as the interstage filter 38 of the reception circuit, the surface acoustic wave according to other preferred embodiments of the present invention is used.

As shown in the above description, in the surface acoustic wave filter according to preferred embodiments of the present invention, at least one of the electrode pads used as input/output terminals is arranged between the longitudinally connected surface acoustic wave elements, and the electrode pads used as ground terminals are arranged outside the mutually opposing surface acoustic wave elements. This arrangement reliably minimizes a parallel capacitance generated at the interstage junction of the longitudinally connected surface acoustic wave elements. As a result, even in the surface acoustic wave filter having a broad pass bandwidth, the impedance of each element hardly becomes capacitive.

In addition, in the surface acoustic wave filter having a balance-unbalance conversion function, with the use of the unique arrangement of preferred embodiments of the present invention, the balance of a balanced terminal is greatly improved.

While preferred embodiments of the present invention have been described above, variations thereto will occur to those skilled in the art within the scope of the present inventive concepts, which are delineated by the following claims.

What is claimed is:

1. A surface acoustic wave filter comprising:
   a piezoelectric substrate;
   a plurality of longitudinally-coupled resonator-type surface acoustic wave elements having a plurality of interdigital transducers disposed on the piezoelectric substrate in a direction in which a surface acoustic wave propagates;
   electrode pads defining input/output terminals of the longitudinally-coupled resonator-type surface acoustic wave elements; and
   wiring patterns arranged to electrically connect the plurality of longitudinally-coupled resonator-type surface acoustic wave elements;
   wherein at least one pair of the longitudinally-coupled resonator-type surface acoustic wave elements is longitudinally connected via the wiring patterns; and
   wherein each of the electrode pads is arranged between the longitudinally connected surface acoustic wave elements.

2. A surface acoustic wave filter according to claim 1, wherein the piezoelectric substrate is a 40±5° Y-cut X-propagation LiTaO₃ substrate.

3. A surface acoustic wave filter according to claim 1, wherein the piezoelectric substrate is one of a 40±5° Y-cut X-propagation LiTaO₃ substrate, a 64° to 72° Y-cut X-propagation LiNbO₃, a substrate of about 41° Y-cut X-propagation LiNbO₃, and the plurality of interdigital transducers includes at least three interdigital transducers.

4. A surface acoustic wave filter according to claim 1, wherein the plurality of interdigital transducers comprises three interdigital transducers disposed on the piezoelectric substrate.

5. A surface acoustic wave filter according to claim 1, further comprising reflectors provided on the piezoelectric substrate on both sides of an area occupied by the plurality of interdigital transducers.

6. A surface acoustic wave filter according to claim 1, wherein at least one of the electrode pads is arranged in a region enclosed by the surface acoustic wave elements that are mutually opposed to each other and the wiring patterns connecting the surface acoustic wave elements.

7. A communication apparatus comprising the surface acoustic wave filter according to claim 1.

8. A surface acoustic wave filter comprising:
   a piezoelectric substrate;
   a plurality of longitudinally-coupled resonator-type surface acoustic wave elements having a plurality of interdigital transducers disposed on the piezoelectric substrate in a direction in which a surface acoustic wave propagates;
   electrode pads defining input/output terminals of the longitudinally-coupled resonator-type surface acoustic wave elements; and
   wiring patterns arranged to electrically connect the plurality of longitudinally-coupled resonator-type surface acoustic wave elements;
   wherein at least one pair of the longitudinally-coupled resonator-type surface acoustic wave elements is longitudinally connected via the wiring patterns and at least one of the electrode pads is arranged between the longitudinally connected surface acoustic wave elements;
   wherein each of the plurality of the interdigital transducers includes electrode fingers, wherein the pitches of a first group of the electrode fingers between the plurality of interdigital transducers is narrower than the pitches of a second group of the electrode fingers between the plurality of interdigital transducers.

9. A surface acoustic wave filter comprising:
   a piezoelectric substrate;
   a plurality of longitudinally-coupled resonator-type surface acoustic wave elements having a plurality of interdigital transducers disposed on the piezoelectric substrate in a direction in which a surface acoustic wave propagates;
   electrode pads defining input/output terminals of the longitudinally-coupled resonator-type surface acoustic wave elements; and
   wiring patterns arranged to electrically connect the plurality of longitudinally-coupled resonator-type surface acoustic wave elements;
   wherein at least one pair of the longitudinally-coupled resonator-type surface acoustic wave elements is longitudinally connected via the wiring patterns and at least one of the electrode pads is arranged between the longitudinally connected surface acoustic wave elements;
   further comprising additional electrode pads defining ground terminals, and wherein each interdigital transducer contains a ground electrode and wherein at least one of the surface acoustic wave elements is arranged such that each of the ground electrodes of the plurality of interdigital transducers of said at least one of the surface acoustic wave element is connected along a surface of the piezoelectric substrate to fl same additional electrode pad.

10. A surface acoustic wave filter according to claim 9, wherein the additional electrode pads are located on the piezoelectric substrate exterior to the region defined by the plurality of longitudinally-coupled resonator-type surface acoustic wave elements.

11. A surface acoustic wave filter comprising:
    a piezoelectric substrate;
    a plurality of longitudinally-coupled resonator-type surface acoustic wave elements having a plurality of interdigital transducers disposed on the piezoelectric substrate in a direction in which a surface acoustic wave propagates;
    electrode pads defining input/output terminals of the longitudinally-coupled resonator-type surface acoustic wave elements; and
    wiring patterns arranged to electrically connect the plurality of longitudinally-coupled resonator-type surface acoustic wave elements;
    wherein at least one pair of the plurality of longitudinally-coupled resonator-type surface acoustic wave elements is longitudinally connected via the wiring patterns and at least one of the longitudinally-coupled resonator-type surface acoustic wave elements is one of a balanced-input type and a balanced-output type; and
    wherein each of the electrode pads is arranged between the longitudinally connected surface acoustic wave elements.

12. A surface acoustic wave filter according to claim 11, wherein the piezoelectric substrate is a 40±5° Y-cut X-propagation $LiTaO_3$ substrate.

13. A surface acoustic wave filter according to claim 11, wherein the piezoelectric substrate is one of a 40±5° Y-cut X-propagation $LiTaO_3$ substrate, a 64° to 72° Y-cut X-propagation $LiNbO_3$, a substrate of about 41° Y-cut X-propagation $LiNbO_3$, and the plurality of interdigital transducers includes at least three interdigital transducers.

14. A surface acoustic wave filter according to claim 11, wherein the plurality of interdigital transducers comprises three interdigital transducers disposed on the piezoelectric substrate.

15. A surface acoustic wave filter according to claim 11, further comprising reflectors provided on the piezoelectric substrate on both sides of an area occupied by the plurality of interdigital transducers.

16. A surface acoustic wave filter according to claim 11, wherein at least one of the electrode pads is arranged in a region enclosed by the surface acoustic wave elements that are mutually opposed to each other and the wiring patterns connecting the surface acoustic wave elements.

17. A communication apparatus comprising the surface acoustic wave filter according to claim 11.

18. A surface acoustic wave filter comprising:
   a piezoelectric substrate;
   a plurality of longitudinally-coupled resonator-type surface acoustic wave elements having a plurality of interdigital transducers disposed on the piezoelectric substrate in a direction in which a surface acoustic wave propagates;
   electrode pads defining input/output terminals of the longitudinally-coupled resonator-type surface acoustic wave elements; and
   wiring patterns arranged to electrically connect the plurality of longitudinally-coupled resonator-type surface acoustic wave elements;
   wherein at least one pair of the plurality of longitudinally-coupled resonator-type surface acoustic wave elements is longitudinally connected via the wiring patterns and at least one of the longitudinally-coupled resonator-type surface acoustic wave elements is one of a balanced-input type and a balanced-output type, at least one of the electrode pads being arranged between the longitudinally connected surface acoustic wave elements;
   wherein each of the plurality of the interdigital transducers includes electrode fingers, wherein the pitches of a first group of the electrode fingers between the plurality of interdigital transducers is narrower than the pitches of a second group of the electrode fingers between the plurality of interdigital transducers.

19. A surface acoustic wave filter comprising:
   a piezoelectric substrate;
   a plurality of longitudinally-coupled resonator-type surface acoustic wave elements having a plurality of interdigital transducers disposed on the piezoelectric substrate in a direction in which a surface acoustic wave propagates;
   electrode pads defining input/output terminals of the longitudinally-coupled resonator-type surface acoustic wave elements; and
   wiring patterns arranged to electrically connect the plurality of longitudinally-coupled resonator-type surface acoustic wave elements;
   wherein at least one pair of the plurality of longitudinally-coupled resonator-type surface acoustic wave elements is longitudinally connected via the wiring patterns and at least one of the longitudinally-coupled resonator-type surface acoustic wave elements is one of a balanced-input type and a balanced-output type, at least one of the electrode pads being arranged between the longitudinally connected surface acoustic wave elements;
   further comprising additional electrode pads defining ground terminals, and wherein each interdigital transducer contains a ground electrode and wherein at least one of the surface acoustic wave elements is arranged such that each of the ground electrodes of the plurality of interdigital transducers of said at least one of the surface acoustic wave element is connected along a surface of the piezoelectric substrate to the same additional electrode pad.

20. A surface acoustic wave filter according to claim 19, wherein the additional electrode pads are located on the piezoelectric substrate exterior to the region defined by the plurality of longitudinally-coupled resonator-type surface acoustic wave elements.

* * * * *